United States Patent
Ramaraju et al.

(10) Patent No.: US 8,143,929 B2
(45) Date of Patent: Mar. 27, 2012

(54) FLIP-FLOP HAVING SHARED FEEDBACK AND METHOD OF OPERATION

(75) Inventors: Ravindraraj Ramaraju, Round Rock, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 96 days.

(21) Appl. No.: 12/607,574

(22) Filed: Oct. 28, 2009

(65) Prior Publication Data

US 2011/0095800 A1 Apr. 28, 2011

(51) Int. Cl.
*H03K 3/356* (2006.01)
(52) U.S. Cl. ........................................ 327/202
(58) Field of Classification Search .................. None
See application file for complete search history.

(56) References Cited

U.S. PATENT DOCUMENTS

| | | | |
|---|---|---|---|
| 5,467,038 A | 11/1995 | Motley et al. | |
| 5,557,225 A | 9/1996 | Denham et al. | |
| 5,656,962 A | 8/1997 | Banik | |
| 5,751,174 A | 5/1998 | Kuo et al. | |
| 5,784,384 A | 7/1998 | Maeno | |
| 6,642,765 B2 | 11/2003 | Markovic et al. | |
| 6,784,694 B2 | 8/2004 | Kim et al. | |
| 6,864,732 B2 | 3/2005 | Chalasani | |
| 7,528,630 B2 | 5/2009 | Kim et al. | |
| 2005/0273677 A1 | 12/2005 | Kinkade et al. | |
| 2007/0162802 A1* | 7/2007 | Miwa | 714/726 |
| 2008/0258789 A1* | 10/2008 | Motomura | 327/202 |
| 2009/0121764 A1* | 5/2009 | Uemura et al. | 327/203 |
| 2011/0248759 A1 | 10/2011 | Chi et al. | |

OTHER PUBLICATIONS

Oklobdija; "Clocking in Multi-GHz Environment"; Proceeding 23rd International Conference on Micorelectronics; May 12-15, 2002; pp. 561-568; vol. 2 IEEE.

* cited by examiner

*Primary Examiner* — Lincoln Donovan
*Assistant Examiner* — Sibin Chen
(74) *Attorney, Agent, or Firm* — Joanna G. Chiu; James L. Clingan, Jr.

(57) ABSTRACT

A method of operating a circuit includes receiving a first data signal at a first node. The first node is coupled to a second node to couple the first data signal to the second node. After coupling the first node to the second node, the second node is coupled to a third node to couple the first data signal to the third node. The first node is decoupled from the second node and a first step of latching the first data signal at the third node is performed, wherein the first step of latching is through the second node while the second node is coupled to the third node. The second node is decoupled from the third node and a second step of latching is performed wherein the first data signal latched at the third node while the second node is decoupled from the third node.

24 Claims, 3 Drawing Sheets

FLIP-FLOP HAVING SHARED FEEDBACK AND METHOD OF OPERATION

BACKGROUND

1. Field

This disclosure relates generally to flip flops, and more specifically, to flip flops having shared feedback.

2. Related Art

Flip flops are commonly used for data storage in a variety of different applications. For example, they may be used to build small on-chip memories such as queue buffers, where each flip flop stores a single bit of data. Typically each flip flop is implemented with both a master and a slave latch. Therefore, the complexity of a flip flop's structure and the number of transistors within each flip flop impacts various factors in the design and manufacture of an integrated circuit, such as design cost, test cost, and circuit area.

FIG. 1 illustrates one example of a prior art master-slave flip flop 10. Flip flop 10 includes an inverter 12, a transmission gate 14, a master latch 16 (which includes two inverters, one of which is a tri-state inverter), a transmission gate 18, a slave latch 20 (which includes two inverters, one of which is a tri-state inverter), and an inverter 22. The data input (D) of flip flop 10 is provided to an input of inverter 12, and an output of inverter 12 is provided to a first data terminal of transmission gate 14. A second data terminal of transmission gate 14 is coupled to a first node of master latch 16, and a second node of master latch 16 is coupled to a first data terminal of transmission gate 18 and second data terminal of transmission gate 18 is coupled to a first node of slave latch 20, and a second node of slave latch 20 is coupled to an input of inverter 22, and an output of inverter 22 is provided as the data output (Q) of flip flop 10. An inverted control terminal of transmission gate 14 receives a clock signal and a non-inverted control terminal of transmission gate 14 receives an inverted clock signal (which is an inverted version of the clock signal). An inverted control terminal of transmission gate 18 receives the inverted clock signal and a non-inverted control terminal of transmission gate 18 receives the clock signal. Also, an inverted control input of the tri-state inverter of master latch 16 receives the inverted clock signal and the non-inverted control input receives the clock signal. An inverted control input of the tri-state inverter of slave latch 20 receives the clock signal and the non-inverted control input receives the inverted clock signal.

In master-slave flip flop 10, when the clock signal is low (logic level 0), slave latch 20 stores the previous value of D ($D_{previous}$) and provides this previous value via inverter 22 as Q, and transmission gate 18 is off. Also, when the clock signal is low, master latch is disabled (because the tri-state inverter is disabled) and transmission gate 14 is on. Therefore, the next value of D ($D_{next}$) is propagated through inverter 12, transmission gate 14, and the enabled inverter of master latch 16. When the clock signal goes high (switches to logic level 1), transmission gate 14 is turned off and master latch 16 is enabled (because the tri-state inverter is again enabled by the clock signal) and latches the next value of D (Dnext). This next value of D is then propagated through transmission gate 18, the enabled inverter of slave latch 20 and inverter 22 and provided as output Q. (Note that slave latch 20 is disabled due to the tri-state inverter of the latch being disabled by the clock signal going high.) Therefore, just prior to a rising edge of the clock, the previous value of D ($D_{previous}$) is continued to be provided at the output Q, and, at some propagation delay after the rising edge of the clock, the next value of D ($D_{next}$) is provided at the output Q.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
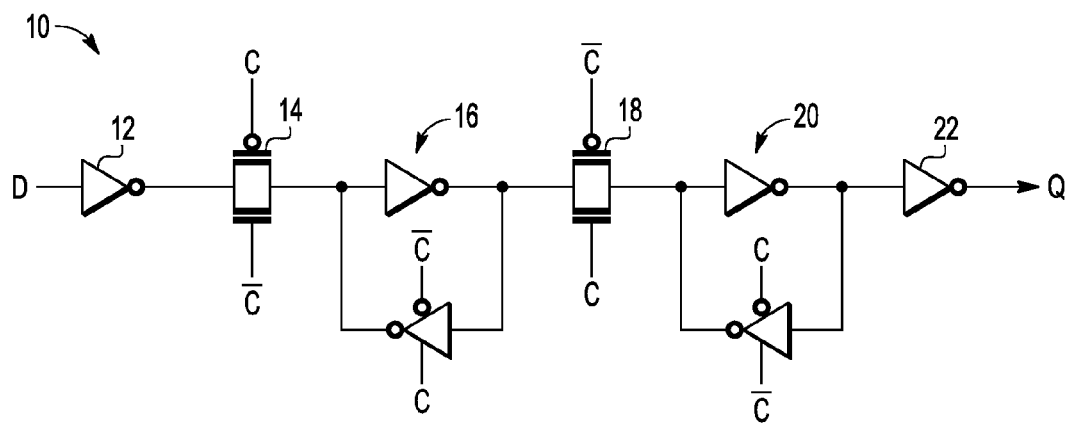
FIG. 1 illustrates, in schematic diagram form, a master-slave flip flop in accordance with the prior art.

In one embodiment, a flip flop includes a shared feedback which prevents the need for having separate master and slave latches, but whose behavior still mimics a master-slave flip flop (such as the master-slave flip flop of FIG. 1). That is, in one embodiment, a flip flop includes a shared feedback which is provided to different nodes of the flip flop as controlled by transitions of a clock signal. For example, in one embodiment, a quadrature clock is used to provide two clock/inverted clock pairs where one clock/inverted clock pair is delayed with respect to the other clock/inverted clock pair. The delayed clock/inverted clock pairs can be used to selectively couple the shared feedback path to different circuit nodes.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name or a "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 2:
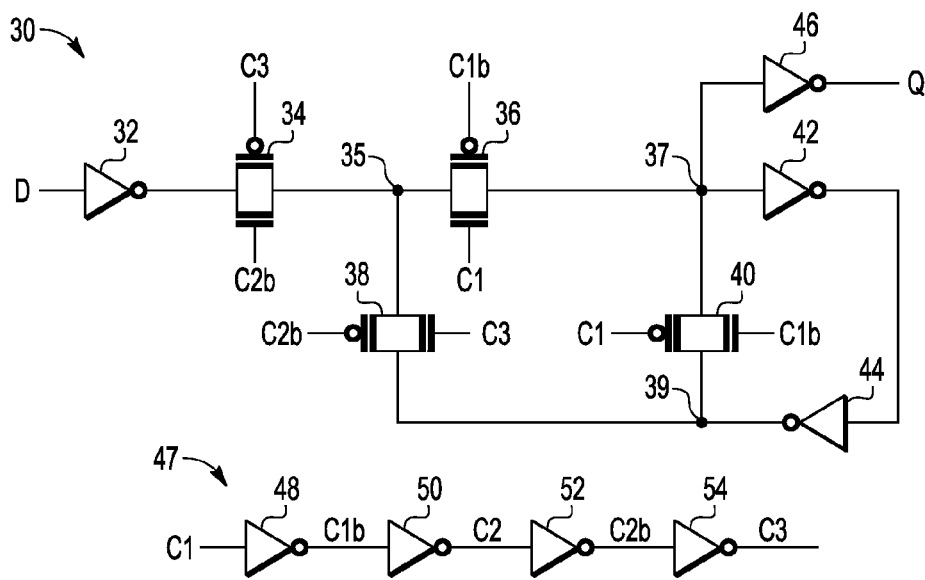
FIG. 2 illustrates, in schematic diagram form, a flip flop having shared feedback in accordance with one embodiment of the present invention.
Figure 5:
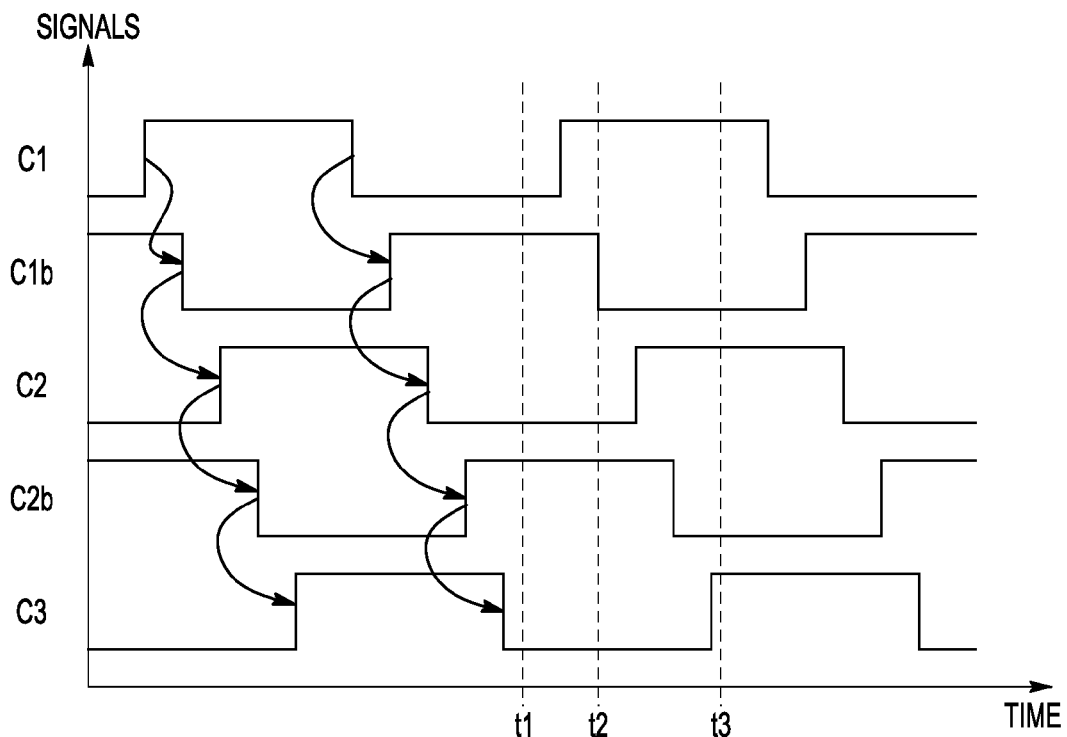
FIG. 5 illustrates, in timing diagram form, various clock signals used with the flip flop of FIG. 2, in accordance with one embodiment of the present invention.

FIG. 2 illustrates clock circuitry 47 and a flip flop 30. Clock circuitry 47 includes inverters 48, 50, 52, and 54. An input of inverter 48 receives a first clock signal, C1, and an output of inverter 48 provides a second clock signal, C1b, where C1b is an inverted and delayed version of C1, and where C1 and C1b together form a pair of complementary clocks. The output of inverter 48 is coupled to an input of inverter 50, and an output of inverter 50 provides a third clock signal, C2, wherein C2 is an inverted and delayed version of C1b, and where C1b and C2 also form a pair of complementary clocks. The output of inverter 50 is coupled to an input of inverter 52, and an output of inverter 52 provides a fourth clock signal, C2b, where C2b is an inverted and delayed version of C2, and where C2 and C2b also form a pair of complementary clocks. The output of inverter 52 is coupled to an input of inverter 54, and an output of inverter 54 provides a fifth clock signal, C3, where C3 is an inverted and delayed version of C2b, and where C2b and C3 also form a pair of complementary clocks. Note that clock circuitry 47 may be referred to as a quadrature clock generator in which 4 clock signals (C1b, C2, C2b, and C3) are generated from a clock signal, C1. FIG. 5 illustrates an example, in timing diagram form, of each of the 5 clock signals, C1, C1b, C2, C2b, and C3. Note that complementary clocks C2 and C2b are delayed (by the propagation delay of 2 inverters) with respect to complementary clocks C1 and C1b. Similarly, note that complementary clocks C2b and C3 are delayed (by the propagation delay of 3 inverters) with respect to complementary clocks C1 and C1b.

As used herein, clocks C1, C2, and C3 are asserted when they are high (a logic level one) and deasserted when they are low (a logic level zero), and clocks C1b and C2b are asserted when they are low (a logic level zero) and deasserted when they are high (a logic level one). That is, clock C1, or those clocks whose rising edges are controlled by the rising edges of clock C1 (such as C2 and C3) are asserted when they are high and deasserted when low. Those clocks whose falling edges are controlled by the rising edges of clock C1 (such as C1b and C2b) are asserted when they are low and deasserted when high. Also, as used herein, a complementary clock pair is considered asserted when C1 is asserted (if the pair includes C1) or when a clock whose rising edge is controlled by the rising edge of C1 (such as C2 or C3) is asserted. For example, complementary clock pair C1 and C1b is considered asserted when C1 is a logic level one, and complementary clock pair C2b and C3 is considered asserted when C3 is a logic level one. Therefore, note that complementary clock pair C2b and C3 is asserted a delay after pair C1 and C1b is asserted (where, in the illustrated embodiment, the delay is provided by inverters 48, 50, 52, and 54). In an alternate embodiment, the convention may be changed such that C1, C2, and C3 are asserted when they are low (a logic level zero) and deasserted when they are high (a logic level one), and C1b and C2b may be asserted when they are high and deasserted when low.

Referring back to FIG. 2, flip flop 30 includes a data input, D, a data output, Q, an inverter 32, inverter 46, inverter 42, inverter 44, a transmission gate 34, a transmission gate 36, a transmission gate 40, and a transmission gate 38. Data input, D, is coupled to an input of inverter 32, an output of inverter 32 is coupled to a first data terminal of transmission gate 34, and a second data terminal of transmission gate 34 is coupled to a circuit node 35. Control terminals of transmission gate 34 are coupled to receive complementary clocks C2b and C3, in which an inverted control terminal of transmission gate 34 is coupled to receive clock C3, and a non-inverted control terminal of transmission gate 34 is coupled to receive clock C2b. Circuit node 35 is coupled to a first data terminal of transmission gate 36 and a second data terminal of transmission gate 36 is coupled to a circuit node 37. Control terminals of transmission gate 36 are coupled to receive complementary clocks C1 and C1b, in which an inverted control terminal of transmission gate 36 is coupled to receive clock C1b, and a non-inverted control terminal of transmission gate 36 is coupled to receive clock C1. Circuit node 35 is coupled to a first data terminal of transmission gate 38, and a second data terminal of transmission gate 38 is coupled to a circuit node 39. Control terminals of transmission gate 38 are coupled to receive complementary clocks C2b and C3, in which an inverted control terminal of transmission gate 38 is coupled to receive clock C2b, and a non-inverted control terminal of transmission gate 38 is coupled to receive clock C2. Circuit node 37 is coupled to a first data terminal of transmission gate 40, and a second data terminal of transmission gate 40 is coupled to circuit node 39. Control terminals of transmission gate 40 are coupled to receive complementary clocks C1 and C1b, in which an inverted control terminal of transmission gate 40 is coupled to receive clock C1, and a non-inverted control terminal of transmission gate 40 is coupled to receive clock C1b. Circuit node 37 is coupled to an input of inverter 46 and to an input of inverter 42. An output of inverter 42 is coupled to an input of inverter 44, and an output of inverter 44 is coupled to circuit node 39. An output of inverter 46 provides data output, Q.

Note that, in alternate embodiments, inverters 42 and 44 can be referred to as inverting elements where any type of inverting element, instead of inverters, may be used. Therefore, any inverter described herein may be referred to as an inverting element in which any type of inverting element including any number of logic gates may be used. Also, note that the data input, D, of flip flop 30 may be located after inverter 32, such as at the first data terminal of transmission gate 34 and the data output, Q, of flip flop 30 may be located at circuit node 37 or at the output of inverter 42. Also, as used herein, when a transmission gate is "on," it is in a conductive state and thus couples its first data terminal to its second data terminal, and when a transmission gate is "off," it is in a non-conductive state and thus decouples its first data terminal from its second data terminal. When a transmission gate is on, it may be considered "transparent" to the circuit and when it is off, it may be considered "opaque" to the circuit.

Operation of FIG. 2 will be described in reference to FIGS. 3 and 4 which illustrate the circuit of flip flop 30 when clock C1 is low (at a logic level 0) and when clock C1 is high (at a logic level one), respectively. Note that, as will be described below, inverting element 44 forms a shared feedback path which is provided to either circuit node 37 or 35 as controlled by clocks C1, C1b, C2b, and C3 and transmission gates 36, 38, and 40. In this manner, a portion of the storage latch of flip flop 30 formed with inverting elements 42 and 44 is shared between phases of clock C1. That is, as will be described in more detail below, prior to the rising edge of C1, the previous value of D ($D_{previous}$) will continue to be stored in a storage latch of flip flop 30 formed with inverting elements 42 and 44 and transmission gate 40 and provided as Q, and, at some delay after the rising edge of the clock, the next value of D ($D_{next}$) is stored in a storage latch of flip flop 30 formed by inverting elements 42 and 44 and transmission gates 38 and 36 and is provided as Q.

Figure 3:
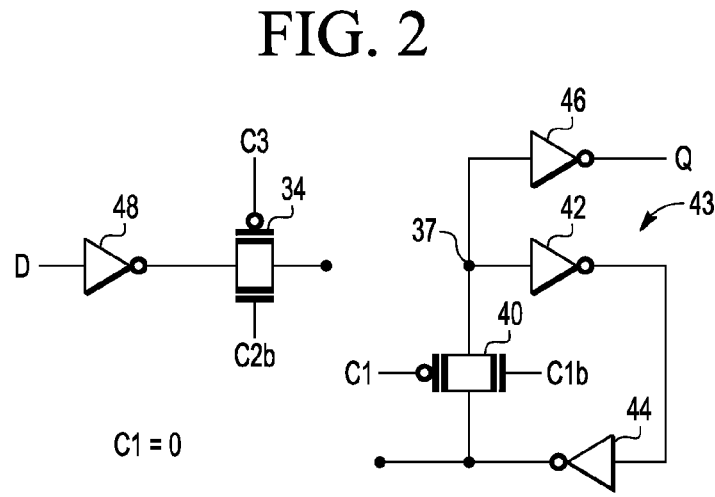
FIG. 3 illustrates, in schematic diagram form, the flip flop of FIG. 2 when a clock signal has a first value, in accordance with one embodiment of the present invention.

FIG. 3 illustrates flip flop 30 during operation when clock C1 is low (and clock C3 is also low). Therefore, referring to FIG. 5, FIG. 3 may correspond to flip flop 30 at a time such as time t1. In FIG. 3, if a transmission gate is off, it is not included in the circuit and is shown as an open space (since the data terminals are decoupled when off), and if a transmission gate is on, it is included in the circuit and is assumed to be in its conductive state. Therefore, in FIG. 3, transmission gates 34 and 40 are on and transmission gates 38 and 36 are off, as controlled by C3, C2b, C1, and C1b. That is, at time t1, since C3 is low and C2b is high, transmission gate 34 is on, and since C1 is low and C1b is high, transmission gate 40 is on. However, since C2b is high, C3 is low, C1 is low, and C1b is high, transmission gates 38 and 36 are off. Therefore, note that storage latch 43, which is formed by inverting elements 42, 44, and transmission gate 40 (when turned on), stores the previous value of D ($D_{previous}$), such that output Q can provide $D_{previous}$. (Note that storage latch 43 may store $D_{previous}$ or an inverted version of $D_{previous}$.) Also, the next value of D ($D_{next}$), is propagated through inverter 48 and is "waiting" at the second data terminal of transmission gate 34. However, it does not yet affect the value of Q since transmission gates 38 and 36 are off.

Figure 4:
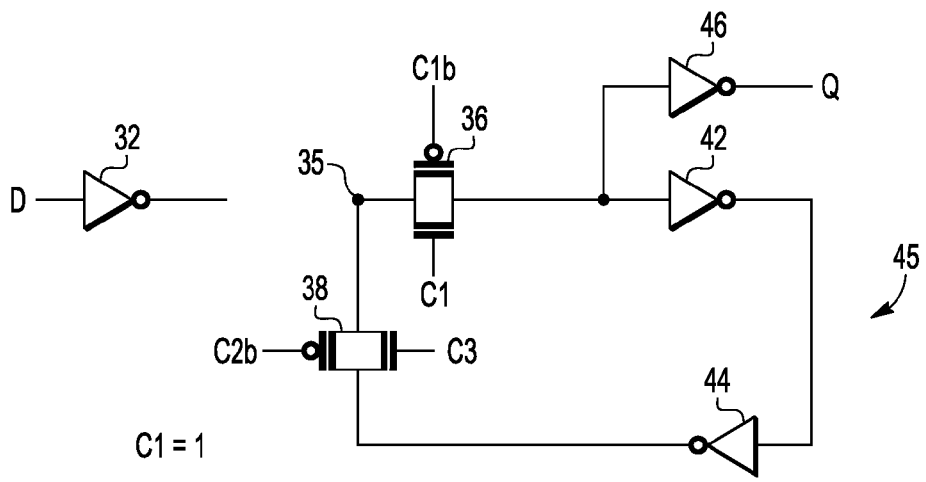
FIG. 4 illustrates, in schematic diagram form, the flip flop of FIG. 2 when the clock signal has a second value, in accordance with one embodiment of the present invention.

FIG. 4 illustrates flip flop 30 during operation when clock C1 is high (and clock C3 is also high). Therefore, referring to FIG. 5, FIG. 4 may correspond to flip flop 30 at a time such as time t3 (which is illustrated as occurring slightly after the rising edge of C3 following t2). In FIG. 4, if a transmission gate is off, it is not included in the circuit and is shown as an open space (since the data terminals are decoupled when off), and if a transmission gate is on, it is included in the circuit and is assumed to be in its conductive state. Therefore, in FIG. 4, transmission gates 38 and 36 are on and transmission gates 34 and 40 are off, as controlled by C3, C2b, C1, and C1b. That is, at time t3, since C3 is high and C2b is low, transmission gate 38 is on, and since C1 is high and C1b is low, transmission gate 36 is on. However, since C2b is low, C3 is high, C1 is high, and C1b is low, transmission gates 34 and 40 are off. Therefore, note that storage latch 45, which is formed by inverting elements 42, 44, and transmission gates 38 and 36 (when turned on), stores or latches the next value of D ($D_{next}$) which was "waiting" at the second data terminal of transmission gate 34, such that output Q can provide $D_{next}$. (Note that storage latch 45 may store $D_{next}$ or an inverted version of $D_{next}$.) Also, since transmission gate 34 is off, the data input D is decoupled from storage latch 45. Note that transmission gates 34 and 38 are both controlled by complementary clocks C2b and C3, and thus are alternately turned on and off, which prevents data contention at circuit node 35.

Note that the next value of D is provided at output Q at some propagation delay after the rising edge of clock C1. For example, in one embodiment, the next value of D is provided at output Q at time t2 (or at time t2+the delay through inverter 46). Note that, at time t2, C1 is high and C1b is low, thus turning on transmission gate 36. However, at time t2, C3 is still low and C2b is still high, thus transmission gate 34 is still turned on. Therefore, at this time, the next value of D that is "waiting" at the second data terminal of transmission gate 34 is propagated through transmission gate 34 and inverter 46 to output Q. Transmission gate 34 is not turned off (and transmission gate 38 is not turned on) until time t3, which, in one embodiment, provides sufficient time for the next value of D ($D_{next}$) to propagate through transmission gate 36, and inverting elements 42 and 44 to circuit node 39. In this manner, the next value of D will properly be latched at time t3 by storage latch 45. Therefore, complementary clocks used to control transmission gates 34 and 38 are delayed by a predetermined delay from the complementary clocks used to control transmission gates 36 and 40. In one embodiment, this predetermined delay is the delay of 3 inverters (inverters 48, 50, and 52); however, in alternate embodiments, complementary clocks C2 and C2b may be used to control transmission gates 34 and 36 instead, which has a smaller delay with respect to complementary clocks C1 and C1b, or complementary clocks with a greater delay may be used.

Note that transmission gate 34 actually begins to turn on with the falling edge of clock C2b prior to time t3; however, it is not until both C2b is low and C3 goes high at time t3 that it is fully conductive for both one's and zero's. That is, for each transmission gate, it may begin to turn on when one of its two control signals is at the appropriate level, but is not fully on until both control signals are at the appropriate level. For example, referring to transmission gates 36 and 40, these gates begin to turn on at the rising edge of C1 or falling edge of C1, respectively, but are not fully turned on until occurrence of the falling edge of C1b or the rising edge of C1b, respectively. The same is so for transmission gates 34 and 38 with respect to control signals C2b and C3.

Therefore, as can be seen in FIGS. 3 and 4, inverting element 44 and transmission gates 38 and 40 provides a shared feedback in that, in the case of FIG. 3, inverting element 44 with transmission gate 40 provides a feedback path to circuit node 37 to form storage latch 43, and in the case of FIG. 4, inverting element 44 with transmission gate 38 provides a feedback path to circuit node 35 to form storage latch 45. In this manner, inverting element 44 and transmission gates 38 and 40 provides a shared feedback for flip flop 30 as controlled by delayed complementary clock pairs (C1/C1b and C2b/C3). For example, referring to FIG. 2, inverting element 44 (where this inverting element can be implemented using one or more gates instead of an inverter) provides a shared feedback which has an input coupled to the output of inverting element 42, a first output coupled to circuit node 37 and a second output coupled to circuit node 35. The shared feedback provides an inverting function between the input of the shared feedback (e.g. the input to inverting element 44) and its first output when a first pair of complementary clocks (e.g. clocks C1/C1b) is deasserted (e.g. when clock C1 of the complementary pair is deasserted or low) since deassertion of pair C1/C1b turns on transmission gate 40, thus coupling the output of inverting element 44 to circuit node 37. The shared feedback provides an inverting function between the input of the shared feedback (e.g. the input to inverting element 44) and its second output when a second pair of complementary clocks (e.g. clocks C3/C2b) is asserted (e.g. when clock C3 of the complementary pair is asserted or high) since assertion of pair C3/C2b turns on transmission gate 38, thus coupling the output of inverting element 44 to circuit node 35.

In alternate embodiments, the delayed complementary clock pairs may be used to control other circuit elements rather than or in addition to transmission gates. For example, the delayed complementary clock pairs may be used as inputs to one or more logic gates used to implement a functionality similar to a transmission gate which selectively alters the feedback path. For example, in an alternate embodiment, inverter 32 and transmission gate 34 can be implemented with a tri-state inverter in which the enable signals of the tri-state inverter can be controlled by clock pair C2b/C3.

In one embodiment, a method of operating flip flop 30 includes receiving a first data signal, D, at a first node (in which the first node may correspond to the input or output of inverter 32, depending on whether inverter 32 is present in flip flop 30). The first node is coupled to a second node (such as circuit node 35), and after the first node is coupled to the second node, the second node is coupled to a third node (such as circuit node 37) in order to couple the first data signal, D, to the third node. In this manner, note that the value of D can be used to provide the next value of Q. The first node can then be decoupled from the second node (as described, for example, in reference to FIG. 4, in which transmission gate 34 is off) and a first step of latching the first data signal at the third node is performed, wherein this first step of latching is through the second node while the second node is coupled to the third node. For example, this first step of latching may be performed by latch 45. The second node can then be decoupled from the third node (as described, for example, in reference to FIG. 3, in which transmission gate 36 is off) and a second step of latching the first data signal at the third node is performed without using the second node. For example, this second step of latching may be performed by latch 43.

Figure 6:
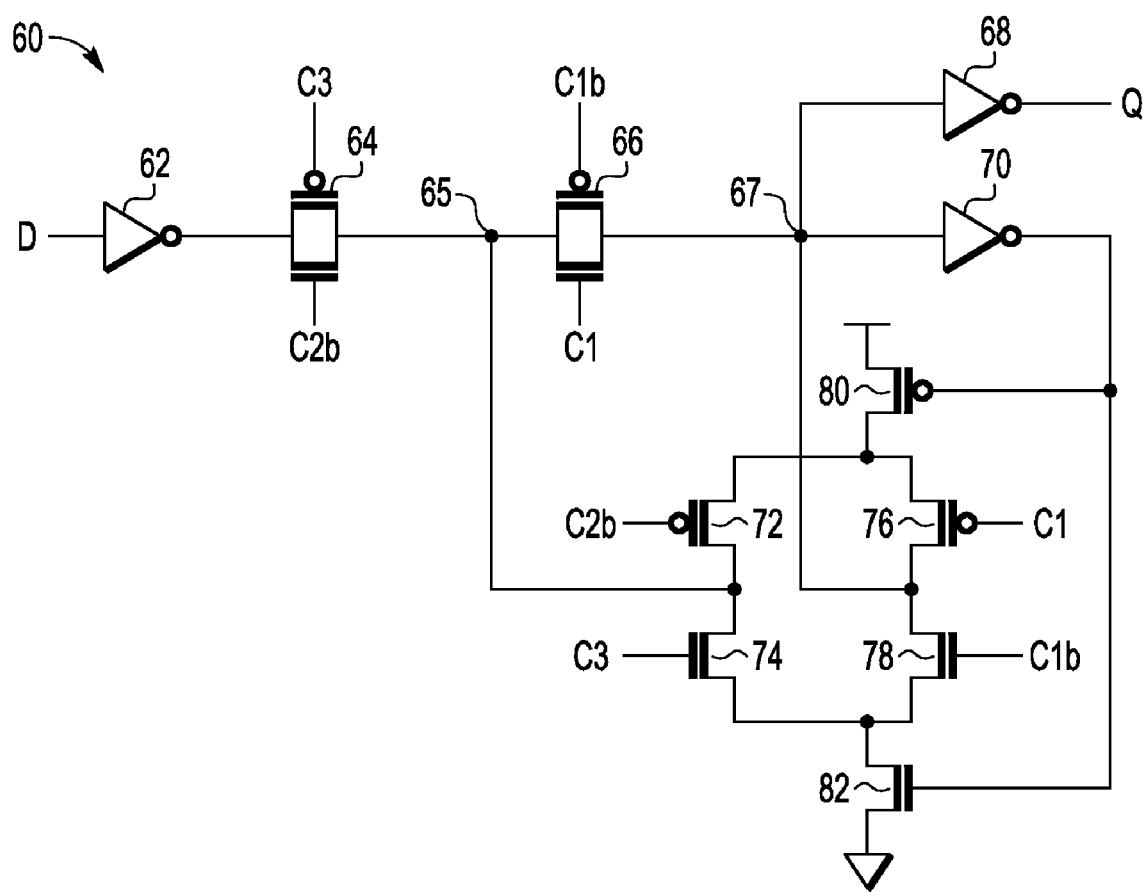
FIG. 6 illustrates, in schematic diagram form, a flip flop having shared feedback in accordance with one embodiment of the present invention.

FIG. 6 illustrates a flip flop 60 having a shared feedback path in accordance with one embodiment of the present invention. Note that clock circuitry 47 may also be used to control flip flop 60. Flip flop 60 includes a data input, D, a data output, Q, an inverter 62, inverter 68, inverter 70, a transmission gate 64, a transmission gate 66, P channel transistors 72, 80, and 76, and N channel transistors 74, 78, and 82. Data input, D, is coupled to an input of inverter 62, an output of inverter 62 is coupled to a first data terminal of transmission gate 64, and a second data terminal of transmission gate 64 is coupled to a circuit node 65. Control terminals of transmission gate 64 are coupled to receive complementary clocks C2b and C3, in which an inverted control terminal of transmission gate 64 is coupled to receive clock C3, and a non-inverted control terminal of transmission gate 64 is coupled to receive clock C2b. Circuit node 65 is coupled to a first data terminal of transmission gate 66 and a second data terminal of transmission gate 66 is coupled to a circuit node 67. Control terminals of transmission gate 66 are coupled to receive complementary clocks C1 and C1b, in which an inverted control terminal of transmission gate 66 is coupled to receive clock C1b, and a non-inverted control terminal of transmission gate 66 is coupled to receive clock C1. Circuit node 67 is coupled to an input of inverter 68 and to an input of inverter 70. An output of inverter 68 provides data output, Q. An output of inverter 70 is coupled to a control electrode (i.e. control gate) of transistor 80 and a control electrode (i.e. control gate) of transistor 82. A first current electrode (e.g. source) of transistor 80 is coupled to a first power supply terminal (e.g. a Vdd power supply terminal or a positive power supply terminal), and a second current electrode (e.g. drain) of transistor 80 is coupled to first current electrodes (e.g. sources) of each of transistors 72 and 76. A second current electrode (e.g. drain) of transistor 76 is coupled to circuit node 67 and to a first current electrode (e.g. drain) of transistor 78. A second current electrode (e.g. drain) of transistor 72 is coupled to circuit node 65 and to a first current electrode (e.g. drain) of transistor 74. Second current electrodes (e.g. sources) of each of transistor 74 and 78 is coupled to a first current electrode (e.g. drain) of transistor 82, and a second current electrode (e.g. source) of transistor 82 is coupled to a second power supply terminal (e.g. a Vss or ground power supply terminal).

Note that the data input, D, of flip flop 60 may be located after inverter 62, such as at the first data terminal of transmission gate 64 and the data output, Q, of flip flop 60 may be located at circuit node 67 or at the output of inverter 70.

In operation, transistors 72, 74, 76, 78, 80 and 82 provide a shared feedback path which is provided from the output of inverting element 70 to either circuit node 67 or 65 as controlled by clocks C1, C1b, C2b, and C3, transistors 72, 76, 74, and 78, and transmission gate 66. In this manner, a portion of the storage latch of flip flop 60 formed with transistors 80 and 82 and inverting element 70 is shared between phases of clock C1. For example, prior to the rising edge of C1 (such as at time t1 in FIG. 5), the previous value of D ($D_{previous}$) will continue to be stored in a storage latch of flip flop 60 formed with inverting element 70 and an inverting element created by transistors 80, 76, 78, and 82 and provided as Q. That is, since C1 is low and C1b is high, transistors 76 and 78 are on, and since C3 is low and C2b is high, transistors 72 and 74 are off. (Note that the storage latch may store $D_{previous}$ or an inverted version of $D_{previous}$.) Also, the next value of D ($D_{next}$), is propagated through inverter 62 and is "waiting" at the second data terminal of transmission gate 64. However, it does not yet affect the value of Q since transmission gate 66 is off and transistors 72 and 74 are off.

Then, at some delay after the rising edge of clock C1, the next value of D ($D_{next}$), which was "waiting" at the second data terminal of transmission gate 64, is stored in a storage latch of flip flop 60 formed by transmission gate 66, inverting element 70 and an inverting element created by transistors 80, 72, 74, and 82 and is provided as Q. For example, at time t3 (as shown in FIG. 5), since C1 is high and C1b is low, transistors 76 and 78 are off and transmission gate 66 is on, and since C3 is high and C2b is low, transistors 72 and 74 are on and transmission gate 64 is off. (Note that storage latch may store $D_{next}$ or an inverted version of $D_{next}$.) Also, since transmission gate 64 is off, the data input D is decoupled from the storage latch of flip flop 60. Note that transmission gate 64 and transistors 72 and 74 are both controlled by complementary clocks C2b and C3, and thus are alternately turned on and off, which prevents data contention at circuit node 65.

Note that the next value of D is provided at output Q at some propagation delay after the rising edge of clock C1. For example, in one embodiment, the next value of D is provided at output Q at time t2 (or at time t2+the delay through inverter 68). Note that, at time t2, C1 is high and C1b is low, thus turning on transmission gate 66. However, at time t2, C3 is still low and C2b is still high, thus transmission gate 64 is still turned on. Therefore, at this time, the next value of D that is "waiting" at the second data terminal of transmission gate 64 is propagated through transmission gate 64 and inverter 68 to output Q. Transmission gate 64 is not turned off (and transistors 72 and 74 are not turned on) until time t3, which, in one embodiment, provides sufficient time for the next value of D ($D_{next}$) to propagate through transmission gate 66, and inverting elements 70, and the inverting element formed by transistors 72 and 74. In this manner, the next value of D will properly be latched at time t3 by the storage latch of flip flop 60. Therefore, complementary clocks used to control transmission gate 64 and transistors 72 and 74 are delayed by a predetermined delay from the complementary clocks used to control transmission gate 66 and transistors 76 and 78. In one embodiment, this predetermined delay is the delay of 3 inverters (inverters 48, 50, and 52); however, in alternate embodiments, complementary clocks C2 and C2b may be used to control transmission gates 64 and 66 instead, which has a smaller delay with respect to complementary clocks C1 and C1b, or complementary clocks with a greater delay may be used.

Therefore, referring to FIG. 6, a shared feedback may have an input coupled to the output of inverting element 70 (where this inverting element can be implemented using one or more gates instead of an inverter) and a first output coupled to a first circuit node (e.g. node 67) and a second output coupled to a second circuit node (e.g. node 65) The shared feedback provides an inverting function between the input of the shared feedback (e.g. the output of inverting element 70) and its first output when a first pair of complementary clocks (e.g. clocks C1/C1b) is deasserted (e.g. when clock C1 of the complementary pair is deasserted or low) since deassertion of pair C1/C1b turns on transistors 76 and 78. For example, the first output provides an inversion of the signal present on the output of inverting element 70 when the first pair of complementary clocks is deasserted. The shared feedback provides an inverting function between the input of the shared feedback (e.g. the output of inverting element 70) and its second output when a second pair of complementary clocks (e.g. clocks C3/C2b) is asserted (e.g. when clock C3 of the complementary pair is asserted or high) since assertion of pair C3/C2b turns on transistors 72 and 74. For example, the second output provides an inversion of the signal present on the output of inverting element 70 when the second pair of complementary clocks is asserted.

In alternate embodiments, the delayed complementary clock pairs may be used to control other circuit elements rather than or in addition to transmission gates. For example, the delayed complementary clock pairs may be used as inputs to one or more logic gates used to implement a functionality similar to a transmission gate which selectively alters the feedback path. For example, in an alternate embodiment, inverter 62 and transmission gate 64 can be implemented with a tri-state inverter in which the enable signals of the tri-state inverter can be controlled by clock pair C2b/C3.

In one embodiment, a method of operating flip flop 60 includes receiving a first data signal, D, at a first node (in which the first node may correspond to the input or output of inverter 62, depending on whether inverter 62 is present in flip flop 60). The first node is coupled to a second node (such as circuit node 65), and after the first node is coupled to the second node, the second node is coupled to a third node (such as circuit node 67) in order to couple the first data signal, D, to the third node. In this manner, note that the value of D can be used to provide the next value of Q. The first node can then be decoupled from the second node (such as when transmission gate 64 is off) and a first step of latching the first data signal at the third node is performed, wherein this first step of latching is through the second node while the second node is coupled to the third node (such as by transmission gate 66 being on, transistors 74 and 72 being on, and transistors 76 and 78 being off). The second node can then be decoupled from the third node (such as when transmission gate 66 is off) and a second step of latching the first data signal at the third node is performed without using the second node (such as by transistors 76 and 78 being on and transistors 72 and 74 being off).

By now it should be appreciated that there has been provided a flip flop with shared feedback where a portion of the storage latch of the flip flop can be shared between phases of the clock. In this manner, the functionality of a master-slave flip flop can be achieved with reduced transistors. For example, a typically master-slave flip flop, as shown in FIG. 1, includes 16 transistors. However, flip flop 30 includes only 12 transistors (note that the inverters coupled to D or Q are not counted in these counts since they may or may not be present). While, for a typical master-slave flip flop, a single pair of complementary clocks may be used to control the transmission gates of the flip flop, for flip flops 30 or 60, two pairs of complementary clocks, delayed from each other, are used to control the data paths of the flip flop. Therefore, the clock circuitry used for flip flops 30 or 60 may use additional transistors as compared to the number of transistors needed in the generation of a single pair of complementary clocks. However, in the case of small on-chip memories which use numerous flip flops, the clock circuitry (such as clock circuitry 47) can be shared among multiple flip flops, thus possibly achieving a reduced transistor count and thus reduced area as compared to using traditional master-slave flip flops for the on-chip memory. Also, note that the number of inverter stages in clock circuitry 47 is not limited to the number of inverter stages described and can be different, as required during the implementation. Furthermore, even though flip flops 30 and 60 include a reduced transistor count, they can emulate the behavior of a traditional master-slave flip flop, and thus can be used in scan testing. For example, as known in the art, the input D can be a multiplexed input coupled to receive data from other circuits in normal operating mode and coupled to receive test data during scan testing. In this manner, an on-chip memory built with flip flops such as flip flops 30 or 60 can easily be tested as well.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other logic gate configurations can be used in place of transmission gates or other logic gate configurations can be used to implement inverting elements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of operating a circuit including receiving a first data signal at a first node; coupling the first node to a second node to couple the first data signal to the second node; after coupling the first node to the second node, coupling the second node to a third node to couple the first data signal to the third node; decoupling the first node from the second node and performing a first step of latching the first data signal at the third node, wherein the first step of latching is through the second node while the second node is coupled to the third node; and decoupling the second node from the third node and performing a second step of latching the first data signal to the third node, wherein the second step of latching is while the second node is decoupled from the third node. Item 2 includes the method of item 1, wherein the first step of latching includes inverting the first data signal at the third node to produce an inverted first data signal at a fourth node; providing a latching first data signal to a fifth node, wherein the latching first data signal is an inversion of the inverted first data signal; and coupling the fifth node to the third node through the second node. Item 3 includes the method of item 2, wherein the second step of latching includes continuing to provide the latching first data signal to the fifth node; and coupling the fifth node directly to the third node. Item 4 includes the method of item 3, and further includes unlatching the first data signal from the third node by decoupling the fifth node from the third node. Item 5 includes the method of item 4, and further includes receiving a second data signal at the first node; coupling the first node to the second node to couple the second data signal to the second node; unlatching the first data signal from the third node by decoupling the fifth node from the third node; and coupling the second node to the third node to provide the second data signal to the third node. Item 6 includes the method of item 5, and further includes providing a data output signal inverted from the second data signal received at the third node. Item 7 includes the method of item 2, wherein the first step of latching includes providing a latching first data signal to the second node when the first node is decoupled from the second node, wherein the latching first data signal is an inversion of the inverted first data signal. Item 8 includes the method of item 7, wherein the second step of latching includes providing a latching second signal to the third node when the second node is decoupled from the third node, wherein the latching second signal is an inversion of the inverted first data signal. Item 9 includes the method of item 7, and further includes receiving a second data signal at the first node; coupling the first node to the second node to provide the second data signal to the second node; and terminating the second step of latching and coupling the second node to the third node to provide the second data signal to the third node. Item 10 includes the method of item 9, and further includes, after the step of terminating, decoupling the first node from the second node and latching the second data signal at the third node.

Item 11 includes a circuit having a first inverting element having an input coupled to a first node and an output; a first transmission gate clocked by a first pair of complementary clocks having a first terminal coupled to the first node and a second terminal coupled to a second node; a gate clocked by a second pair of complementary clocks delayed from the first pair of complementary clocks having a first terminal coupled to the second node and a second terminal coupled to a third node, wherein the third node receives an input signal; and a shared feedback circuit having an input coupled to the output of the first inverting element, a first output coupled to the first node, and a second output coupled to the second node, wherein the shared feedback circuit is for providing an inverting function between the input of the shared feedback circuit and the first output of the shared feedback circuit when the first pair of complementary clocks are deasserted and providing an inverting function between the input of the shared feedback circuit and the second output of the shared feedback circuit when the second pair of complementary clocks are asserted. Item 12 includes the circuit of claim 11, wherein the first transmission gate couples the first node to the second node when the first pair of complementary clocks are asserted. Item 13 includes the circuit of item 12, wherein the gate comprises a second transmission gate, and wherein the second transmission gate couples the second node to the third node when the second pair of complementary clocks are deasserted. Item 14 includes the circuit of item 11, wherein the shared feedback circuit includes a second inverting element having an input coupled to the output of the first inverting element and an output; a third transmission gate clocked by the first pair of complementary clocks having a first terminal coupled to the output of the second inverting element and a second terminal coupled to the first node; and a fourth transmission gate clocked by the second pair of complementary clocks having a first terminal coupled to the output of the second inverting element and a second terminal coupled to the second node. Item 15 includes the circuit of item 14, wherein the third transmission gate couples the output of the second inverting element to the first node in response to the first pair of complementary clocks being deasserted and decouples the output of the second inverting element from the first node in response to the first pair of complementary clocks being asserted. Item 16 includes the circuit of item 11, wherein the shared feedback circuit includes a first pair of transistors wherein a first coupling transistor is coupled to a first power supply terminal and a second coupling transistor is coupled to a second power supply terminal and have control gates coupled to the output of the first inverting element; a first P channel transistor having a source coupled to the first coupling transistor, a gate for receiving a first clock signal of the first pair of complementary clocks, and a drain coupled to the first node; a first N channel transistor having a source coupled to the second coupling transistor, a gate for receiving a second clock signal of the first pair of complementary clocks, and a drain coupled to the first node; a second P channel transistor having a source coupled to the first coupling transistor, a gate for receiving a first clock signal of the second pair of complementary clocks, and a drain coupled to the second node; and a second N channel transistor having a source coupled to the second coupling transistor, a gate for receiving a second clock signal of the second pair of complementary clocks, and a drain coupled to the second node. Item 17 includes the circuit of item 16, wherein the first coupling transistor is a P channel transistor having a source coupled to the first power supply terminal in which the first power supply terminal is for receiving a positive power supply voltage, a gate coupled to the output of the first inverting element, and a drain coupled to the sources of the first and second P channel transistors; and the second coupling transistor is an N channel transistor having a source coupled to the second power supply terminal in which the second power supply terminal is for ground, a gate coupled to the output of the first inverting element, and a drain coupled to the sources of the first and second N channel transistors.

Item 18 includes a circuit having a first transmission gate clocked by a first pair of complementary clocks having a first terminal and a second terminal, wherein the first transmission gate couples its first terminal to its second terminal when the first pair of complementary clocks are asserted and decouples its first terminal from its second terminal when the first pair of complementary clocks are deasserted; a second transmission gate clocked by a second pair of complementary clocks having a first terminal coupled to the first terminal of the first transmission gate and a second terminal for receiving a data signal, wherein the second transmission gate couples its first terminal to its second terminal when the second pair of complementary clocks are deasserted and decouples its first terminal from its second terminal when the second pair of complementary clocks are asserted; a first inverting element having an input coupled to the second terminal of the first transmission gate and an output; and a shared feedback circuit having an input coupled to the output of the first inverting element, a first output coupled to the second terminal of the first transmission gate that provides an inversion of an input signal present on the input of the shared feedback circuit in response to the first pair of complementary clocks being deasserted, and a second output coupled to the first terminals of the first and second transmission gates that provides an inversion of the input signal present on the input of the shared feedback circuit in response to the second pair of complementary clocks being asserted. Item 19 includes the circuit of item 18, wherein the shared feedback circuit is further characterized by the first output providing a high impedance in response to the first pair of complementary clock signals being asserted and the second output providing a high impedance in response to the second pair of complementary clock signals being deasserted. Item 20 includes the circuit of item 19, wherein the first inverting element comprises one of a group consisting of an inverter and an inverting logic gate having a control input.

What is claimed is:

1. A method of operating a circuit during a normal mode of operation using a clock signal, comprising:
   receiving a first data signal at a first node;
   coupling the first node to a second node in response to assertion of a first pair of complementary clocks to couple the first data signal to the second node;
   after coupling the first node to the second node, coupling the second node to a third node in response to assertion of a second pair of complementary clocks to couple the first data signal to the third node, wherein both the first pair of complementary clocks and the second pair of complementary clocks are generated from the clock signal and the second pair of complementary clocks is delayed with respect to the first pair of complementary clocks;
   decoupling the first node from the second node in response to deassertion of the first pair of complementary clocks and performing a first step of latching the first data signal at the third node, wherein the first step of latching is through the second node while the second node is coupled to the third node; and
   decoupling the second node from the third node in response to deassertion of the second pair of complementary clocks and performing a second step of latching the first data signal to the third node, wherein the second step of latching is while the second node is decoupled from the third node.

2. The method of claim 1, wherein the first step of latching comprises:
   inverting the first data signal at the third node to produce an inverted first data signal at a fourth node;
   providing a latching first data signal to a fifth node, wherein the latching first data signal is an inversion of the inverted first data signal; and
   coupling the fifth node to the third node through the second node.

3. The method of claim 2, wherein the second step of latching comprises:
   continuing to provide the latching first data signal to the fifth node; and coupling the fifth node directly to the third node.

4. The method of claim 3, further comprising:
   unlatching the first data signal from the third node by decoupling the fifth node from the third node.

5. The method of claim 4, further comprising:
   receiving a second data signal at the first node;
   coupling the first node to the second node to couple the second data signal to the second node;
   unlatching the first data signal from the third node by decoupling the fifth node from the third node; and
   coupling the second node to the third node to provide the second data signal to the third node.

6. The method of claim 5, further comprising providing a data output signal inverted from the second data signal received at the third node.

7. The method of claim 2 wherein the first step of latching comprises:
   providing a latching first data signal to the second node when the first node is decoupled from the second node, wherein the latching first data signal is an inversion of the inverted first data signal.

8. The method of claim 7, wherein the second step of latching comprises:
   providing a latching second signal to the third node when the second node is decoupled from the third node, wherein the latching second signal is an inversion of the inverted first data signal.

9. The method of claim 7, further comprising:
   receiving a second data signal at the first node;
   coupling the first node to the second node to provide the second data signal to the second node; and
   terminating the second step of latching and coupling the second node to the third node to provide the second data signal to the third node.

10. The method of claim 9, further comprising, after the step of terminating, decoupling the first node from the second node and latching the second data signal at the third node.

11. The method of claim 1 wherein the first step of latching comprises:
   providing a latching first data signal to the second node when the first node is decoupled from the second node, wherein the latching first data signal is an inversion of the inverted first data signal.

12. The method of claim 11, wherein the second step of latching comprises:
   providing a latching second signal to the third node when the second node is decoupled from the third node, wherein the latching second signal is an inversion of the inverted first data signal.

13. The method of claim 11, further comprising:
   receiving a second data signal at the first node;
   coupling the first node to the second node to provide the second data signal to the second node; and
   terminating the second step of latching and coupling the second node to the third node to provide the second data signal to the third node.

14. The method of claim 13, further comprising, after the step of terminating, decoupling the first node from the second node and latching the second data signal at the third node.

15. A circuit, comprising:
   clock circuitry which receives a clock signal and generates both a first pair of complementary clocks and a second pair of complementary clocks from the clock signal, wherein the second pair of complementary clocks is delayed from the first pair of complementary clocks;
   a first inverting element having an input coupled to a first node and an output;
   a first transmission gate clocked by the first pair of complementary clocks having a first terminal coupled to the first node and a second terminal coupled to a second node;
   a gate clocked by the second pair of complementary clocks having a first terminal coupled to the second node and a second terminal coupled to a third node, wherein the third node receives an input signal; and a shared feedback circuit having an input coupled to the output of the first inverting element, a first output coupled to the first node, and a second output coupled to the second node, wherein the shared feedback circuit is for providing an inverting function between the input of the shared feedback circuit and the first output of the shared feedback circuit when the first pair of complementary clocks are deasserted during a normal mode of operation, and providing an inverting function between the input of the shared feedback circuit and the second output of the shared feedback circuit when the second pair of complementary clocks are asserted during the normal mode of operation.

16. The circuit of claim 15, wherein the first transmission gate couples the first node to the second node when the first pair of complementary clocks are asserted.

17. The circuit of claim 16, wherein the gate comprises a second transmission gate, and wherein the second transmission gate couples the second node to the third node when the second pair of complementary clocks are deasserted.

18. The circuit of claim 15, wherein the shared feedback circuit comprises:
   a second inverting element having an input coupled to the output of the first inverting element and an output;
   a third transmission gate clocked by the first pair of complementary clocks having a first terminal coupled to the output of the second inverting element and a second terminal coupled to the first node; and
   a fourth transmission gate clocked by the second pair of complementary clocks having a first terminal coupled to the output of the second inverting element and a second terminal coupled to the second node.

19. The circuit of claim 18, wherein the third transmission gate couples the output of the second inverting element to the first node in response to the first pair of complementary clocks being deasserted and decouples the output of the second inverting element from the first node in response to the first pair of complementary clocks being asserted.

20. A circuit comprising:
   a first inverting element having an input coupled to a first node and an output;
   a first transmission gate clocked by a first pair of complementary clocks having a first terminal coupled to the first node and a second terminal coupled to a second node;
   a gate clocked by a second pair of complementary clocks delayed from the first pair of complementary clocks having a first terminal coupled to the second node and a second terminal coupled to a third node, wherein the third node receives an input signal; and
   a shared feedback circuit having an input coupled to the output of the first inverting element, a first output coupled to the first node, and a second output coupled to the second node, wherein the shared feedback circuit is for providing an inverting function between the input of the shared feedback circuit and the first output of the shared feedback circuit when the first pair of complementary clocks are deasserted and providing an inverting function between the input of the shared feedback circuit and the second output of the shared feedback circuit when the second pair of complementary clocks are asserted;
   wherein the shared feedback circuit comprises:
      a first pair of transistors wherein a first coupling transistor is coupled to a first power supply terminal and a second coupling transistor is coupled to a second power supply terminal and have control gates coupled to the output of the first inverting element;
      a first P channel transistor having a source coupled to the first coupling transistor, a gate for receiving a first clock signal of the first pair of complementary clocks, and a drain coupled to the first node;
      a first N channel transistor having a source coupled to the second coupling transistor, a gate for receiving a second clock signal of the first pair of complementary clocks, and a drain coupled to the first node;
      a second P channel transistor having a source coupled to the first coupling transistor, a gate for receiving a first clock signal of the second pair of complementary clocks, and a drain coupled to the second node; and
      a second N channel transistor having a source coupled to the second coupling transistor, a gate for receiving a second clock signal of the second pair of complementary clocks, and a drain coupled to the second node.

21. The circuit of claim 20, wherein:
the first coupling transistor is a P channel transistor having a source coupled to the first power supply terminal in which the first power supply terminal is for receiving a positive power supply voltage, a gate coupled to the output of the first inverting element, and a drain coupled to the sources of the first and second P channel transistors; and
the second coupling transistor is an N channel transistor having a source coupled to the second power supply terminal in which the second power supply terminal is for ground, a gate coupled to the output of the first inverting element, and a drain coupled to the sources of the first and second N channel transistors.

22. A circuit, comprising:
clock circuitry which receives a clock signal and generates both a first pair of complementary clocks and a second pair of complementary clocks from the clock signal;
a first transmission gate clocked by the first pair of complementary clocks having a first terminal and a second terminal, wherein the first transmission gate couples its first terminal to its second terminal when the first pair of complementary clocks are asserted and decouples its first terminal from its second terminal when the first pair of complementary clocks are deasserted;
a second transmission gate clocked by the second pair of complementary clocks having a first terminal coupled to the first terminal of the first transmission gate and a second terminal for receiving a data signal, wherein the second transmission gate couples its first terminal to its second terminal when the second pair of complementary clocks are deasserted and decouples its first terminal from its second terminal when the second pair of complementary clocks are asserted;
a first inverting element having an input coupled to the second terminal of the first transmission gate and an output; and
a shared feedback circuit having an input coupled to the output of the first inverting element, a first output coupled to the second terminal of the first transmission gate that provides an inversion of an input signal present on the input of the shared feedback circuit in response to the first pair of complementary clocks being deasserted during a normal mode of operation, and a second output coupled to the first terminals of the first and second transmission gates that provides an inversion of the input signal present on the input of the shared feedback circuit in response to the second pair of complementary clocks being asserted during the normal mode of operation.

23. The circuit of claim 22, wherein the shared feedback circuit is further characterized by the first output providing a high impedance in response to the first pair of complementary clock signals being asserted and the second output providing a high impedance in response to the second pair of complementary clock signals being deasserted.

24. The circuit of claim 23, wherein the first inverting element comprises one of a group consisting of an inverter and an inverting logic gate having a control input.

* * * * *